United States Patent [19]
Michels

[11] Patent Number: 5,138,285
[45] Date of Patent: Aug. 11, 1992

[54] METHOD FOR REDUCING PHASE NOISE IN OSCILLATORS

[75] Inventor: Ronald L. Michels, Washington, N.J.

[73] Assignee: Anadigics, Inc., Warren, N.J.

[21] Appl. No.: 732,984

[22] Filed: Jul. 19, 1991

[51] Int. Cl.$^5$ .............................................. H03B 5/00
[52] U.S. Cl. ............................ 331/116 FE; 331/175
[58] Field of Search ........ 331/116 R, 116 FE, 117 R, 331/117 FE, 167, 175, 177 R, 177 V

[56] References Cited

U.S. PATENT DOCUMENTS 4,621,241 11/1986 Kiser ........................... 331/177 V X Primary Examiner—Robert J. Pascal
Attorney, Agent, or Firm—Pennie & Edmonds

[57] ABSTRACT

A simple and broadly applicable method for reducing phase noise in varactor tuned voltage-controlled oscillators (VCOs) is described. In particular, it is shown that by appropriately selecting the inductance of a choke inductor used to isolate the varactor from its DC bias supply, this inductor will also perform a noise filtering function by shunting off part of the internally generated low frequency random electronic noise through the DC supply, thus reducing a primary contributor of oscillator phase noise. Versions of this phase noise reduction method appropriate for the Colpitts, Hartley, and Clapp type LC voltage-controlled oscillator topologies are illustrated.

26 Claims, 4 Drawing Sheets

METHOD FOR REDUCING PHASE NOISE IN OSCILLATORS

BACKGROUND OF THE INVENTION

1. Field of the Invention

The present invention relates generally to voltage-controlled LC oscillators. In particular, it relates to a method for reducing phase noise in voltage-controlled L oscillators of the type which employ an electronically variable capacitive element, such as a varactor diode or other semiconductor device, as a tuning element.

2. Description of the Prior Art

Phase noise is the noise which results from modulations in the oscillation frequency, or carrier frequency, of an oscillator. Because phase noise affects the ability to precisely tune an oscillator, it represents a very important figure of merit for the oscillators used in communication systems and phase-locked loops.

The phase noise performance of voltage-controlled oscillators (VCOs) has become increasingly important with reduced communications channel spacing and more heavily loaded data transmissions. Presently used varactor tuned VCOs often exhibit excessive phase noise.

VCOs are often tuned electronically using a varactor (sometimes called a varicap diode). Since the capacitance of a varactor varies with reverse bias voltage, this capacitance can be effectively used to electronically control the resonant frequency of an LC voltage-controlled oscillator. Unfortunately, the bias voltage on the varactor in such a VCO circuit does not remain constant during circuit operation. Both the fundamental oscillations of the oscillator circuit and the random electronic noise inherent in the circuit can modulate the value of the varactor's capacitance, thus varying the LC resonant frequency and contributing to the phase noise of the VCO. With respect to circuit oscillations, the phase noise resulting from such an intermodulation process exhibits significant separation from the oscillator carrier frequency and, in principle, can be subsequently removed by an appropriate filter. Moreover, the fundamental frequency-selective nature (the "Q") of any tuned oscillator circuit will cause such noise components far from the carrier frequency to be significantly attenuated.

The manifestations of capacitance modulations induced by the inherent random electronic noise are significantly different. The spectral distribution of the random electronic noise is either white (uniformly distributed over all frequencies) or pink (distributed in proportion to 1/f), depending on the physical mechanism of its origin. In all cases, the random electronic noise invariably exhibits significant, if not dominant, low frequency content. Oscillator phase noise which results from a modulation of the carrier frequency of the oscillator with random electronic noise will, by virtue of the spectral distribution of the random noise and the "Q" of the oscillator circuit, exhibit a broad spectral distribution which peaks at the oscillator carrier frequency. In this case, the near-carrier phase noise, that portion of the oscillator phase noise contained within a few percent of the carrier frequency, proves particularly troublesome since it cannot be subsequently removed by any practically realizable filter.

For a varactor tuned oscillator to continuously tune over a wide range, the varactor must exhibit a large change in capacitance in response to a small change in voltage. However, this enables the varactor's own capacitance to be easily modulated by the small random electronic noise signals generated internally by various circuit elements, including the varactor itself. This, as previously stated, modulates the resonant (or carrier) frequency of the VCO, thus contributing significant phase noise. While this problem has been previously recognized, the prior art fails to teach any technique which mitigates the fundamental trade-off between the continuous tuning range of the VCO and the amount of phase noise generated by the varactor capacitance modulation. That is, the greater the continuous tuning range, the greater the phase noise in the VCO. Rather, the prior art has concentrated largely on methods of finding a reasonable tradeoff between oscillator signal amplitude, tuning range, and other similar design parameters. The article entitled "Fundamental Limitations of Oscillator Performance" by M.J. Underhill contains a detailed discussion of prior art methods for minimizing phase noise in varactor tuned VCOs.

The prior art methods for reducing phase noise in varactor tuned VCOs can be approximately classified into two (not entirely mutually exclusive) groups of approaches: those which employ a compound varactor element, and those which employ the varactor in a fine tuning capacity. The first type of approach involves replacing the single varactor with a compound varactor element comprised of one or more varactors connected in series or parallel with one or more fixed capacitors. The objective is to form a compound varactor element with reduced sensitivity to the RF oscillators in the circuit, usually at the expense of reduced tuning range.

In the second type of approach, a small fine tuning varactor is connected in parallel with a larger capacitor to form the tuning element. Since the fine tuning varactor represents only a fraction of the capacitance of the tuning element, the sensitivity of the total capacitance of the tuning element to voltage variations is thereby reduced. In this approach, the tuning rang can be switched by multiplexing additional capacitive elements in parallel with the fine tuning varactor.

Unfortunately, neither of these methods can be used to prevent internally generated random electronic noise from being modulated into the oscillator without sacrificing the continuous tuning range of the VCO. While the high frequency portion of such noise is partially rejected by virtue of the fact that the oscillator circuit is frequency selective (i.e. has a relatively high "Q"), the low frequency portion induces low frequency fluctuations in the varactor's capacitance which directly result in oscillator phase noise. Thus, there exists a need for a method which prevents low frequency random electronic noise from modulating the carrier frequency and increasing VCO phase noise.

In order to facilitate a broad yet precise description of the present invention, the term "varactor" will hereinafter be used to refer to any circuit in which the capacitance across a pair of terminals varies in response to the voltage across these terminals. A few examples include a single varactor, several varactors in series, several varactors in parallel, a varactor and a fixed capacitor in series, a varactor and a fixed capacitor in parallel, and an FET gate capacitor.

SUMMARY OF THE INVENTION

The present invention provides a simple and broadly applicable method for reducing the near-carrier phase noise resulting from the modulation of the carrier frequency by random electronic noise in a voltage-controlled oscillator of the type which employs a varactor. In accordance with the invention, an inductor is provided having an inductance value such that it functions as a high-pass noise filter to shunt low frequency random noise away from the varactor, thus preventing or minimizing the previously described capacitance modulations which lead to increased phase noise.

A key aspect of the present invention is its broad applicability. The method can be used with nearly any circuit technology (bipolar, MOS, GaAs), any oscillator topology (Hartley, Colpitts, Clapp, Pierce), and any type of varactor, as previously defined. Also, it is essentially orthogonal to all of the phase noise reduction techniques known in the prior art, and can thus be employed in conjunction with any of these known techniques to achieve additional phase noise improvement.

BRIEF DESCRIPTION OF THE DRAWINGS

The present invention will be better appreciated with reference to the preferred embodiments illustrated in the accompanying drawings, in which.

DETAILED DESCRIPTION OF THE INVENTION

In any varactor tuned VCO circuit, it is necessary to isolate the varactor's DC biasing supply from the small signal AC feedback loop which comprises the oscillator. Conventionally, either a large resistor or a large inductor (an RF choke) has been employed in this capacity. The present invention uses an inductor, although it may be shunted or in series with resistor. In accordance with the invention, rather than completely isolating the AC signal in the oscillator feedback loop from the DC biasing supply, as with an RF choke, the inductance of this inductor is chosen to be significantly smaller than a conventional choke inductor. Its value is selected to allow the low frequency random electronic noise seen by the varactor to be shunted off into the DC supply (an AC ground node) via the inductor. This shunting of the low frequency noise seen by the varactor to AC ground significantly reduces the phase noise caused by low frequency noise induced modulations of the varactor's capacitance. On the other hand, the inductance of the noise shunting inductor should be chosen significantly larger than the resonant inductor(s) of the oscillator, so as not to affect the resonant frequency of the circuit.

Figure 1:
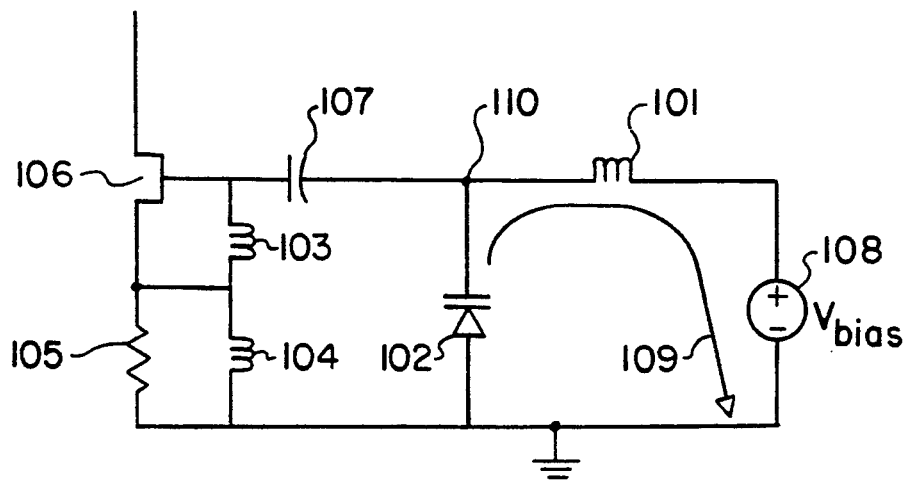
FIG. 1 is a schematic diagram of a Hartley type oscillator employing the invention.

FIG. 1 illustrates an embodiment of the present invention using a Hartley type VCO. The basic Hartley oscillator comprises transistor 106, resistor 105, varactor 102, and inductors 103 and 104. DC blocking capacitor 107 isolates the gate of transistor 106 from the DC bias voltage 108 across varactor 102. In this Hartley VCO, the inductance of inductor 101 is much smaller in relation to other circuit elements than the inductance of similarly disposed inductors in prior art circuits. Conventionally, inductor 101 would be a high inductance RF choke. In accordance with the invention, the inductance of inductor 101 is chosen so that the reactance of inductor 101 will be high in the tuning band of the VCO and low below the tuning band, thereby allowing inductor 101 to effectively short circuit low frequency random electronic noise at varactor terminal 110 to AC ground via current path 109. Thus, inductor 101 performs a noise shunting function.

Figure 2:
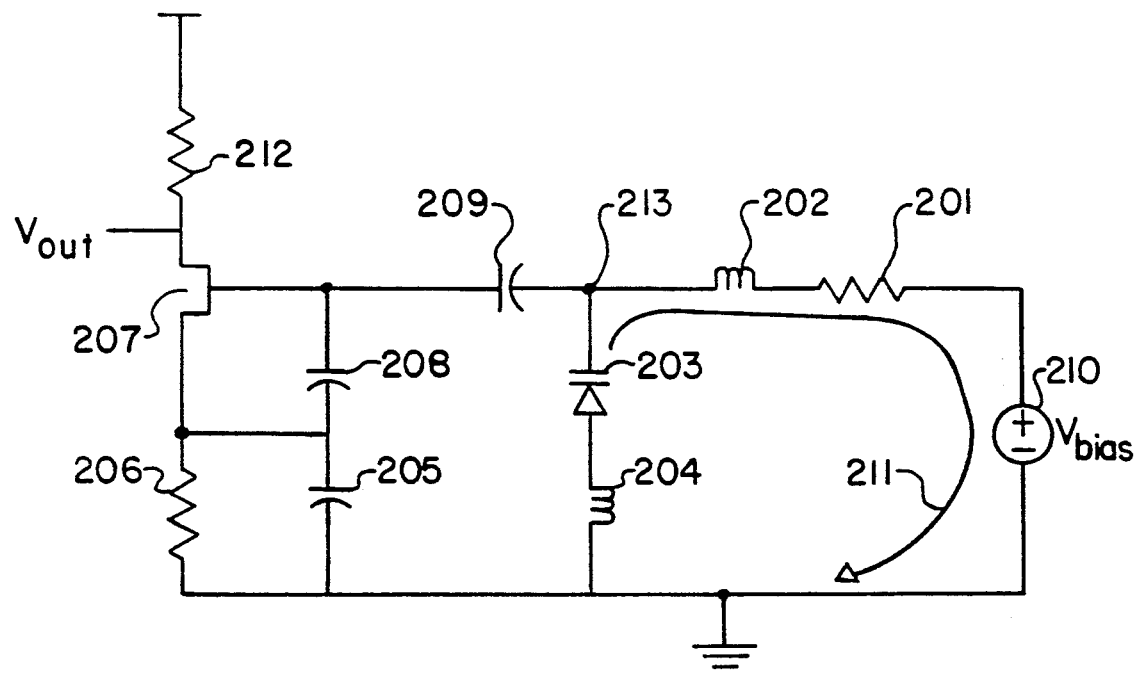
FIG. 2 is a schematic diagram of a Colpitts type oscillator employing the invention.

FIG. 2 shows an embodiment of the present invention using a Colpitts type oscillator. The basic Colpitts oscillator comprises a transistor 207, resistors 206 and 212, varactor 203, inductor 204, and capacitors 205 and 208. DC blocking capacitor 209 isolates the gate of transistor 207 from the DC bias voltage 210 across varactor 203. Like the previously described Hartley oscillator, the present Colpitts oscillator of FIG. 2 is provided an inductor 202, the inductance of which is chosen so that the reactance of inductor 202 is high in the tuning band of the VCO and low below the tuning band. For this Colpitts oscillator, an additional resistor 201 in series with inductor 202 prevents a secondary frequency of oscillation caused by inductor 202. The value of resistor 201 is made large enough to prevent any secondary oscillations yet small enough so that resistor 201 does not itself become a significant source of thermal noise. With inductor 202 and resistor 201 selected in this manner, low frequency random electronic noise will be effectively shorted from varactor terminal 213 to AC ground via current path 211. Thus, inductor 202 and resistor 201 perform a noise shunting function.

Figure 3:
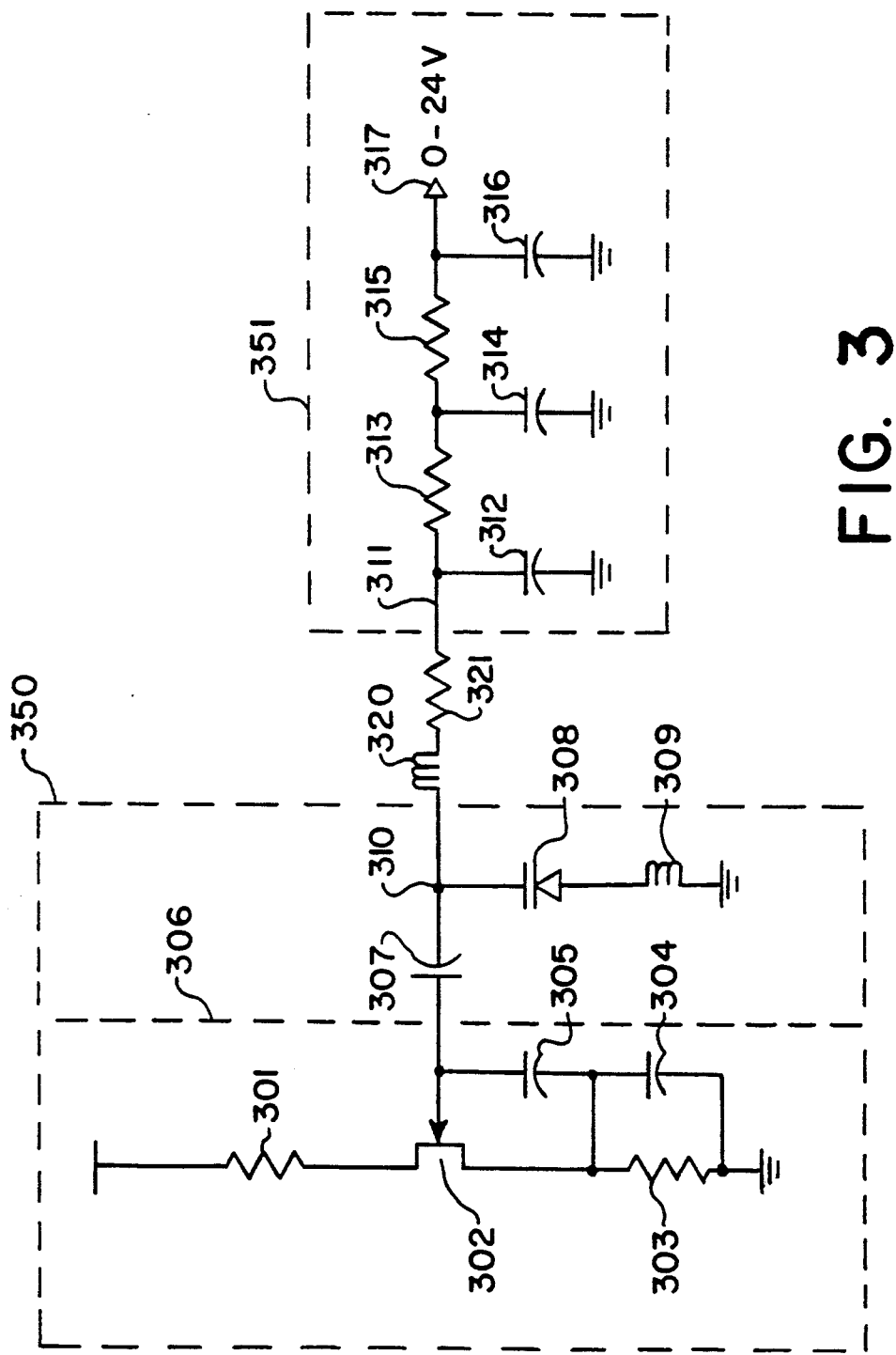
FIG. 3 is a schematic diagram of a Clapp type oscillator employing the invention.
Figure 4:
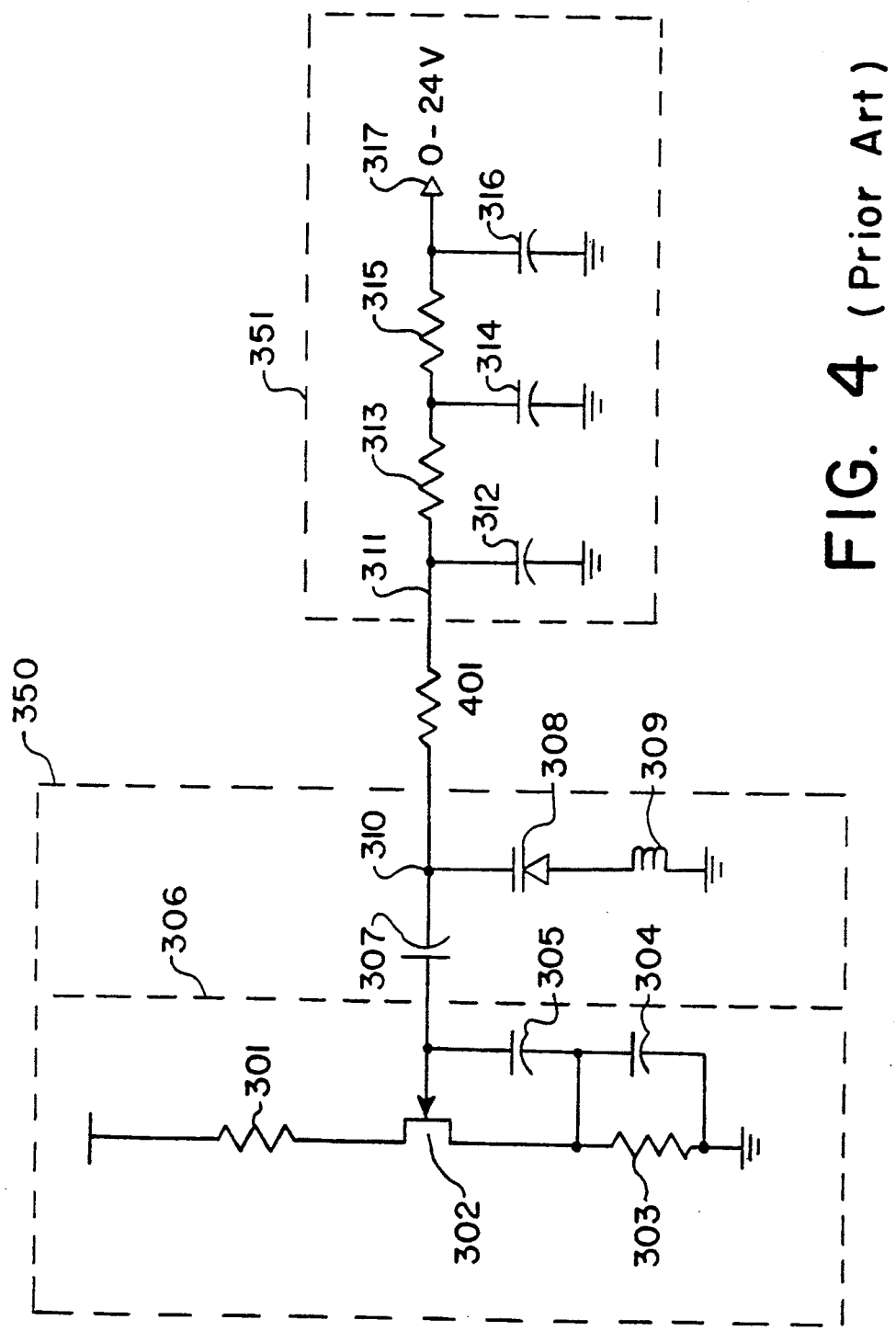
FIG. 4 shows a prior art oscillator similar to that of FIG. 3 except that it does not employ the phase noise reduction method of the invention; and, FIG. 5 depicts the frequency spectra of the oscillators shown in FIGS. 3 and 4, demonstrating the reduction of phase noise achieved in accordance with the invention.

A preferred embodiment is shown in FIG. 3, which is a schematic diagram of a Clapp type oscillator in accordance with the invention. FIG. 4 shows a similar Clapp type oscillator in accordance with the prior art. FIGS. 3 and 4 both show the same basic oscillator circuit 350 and the same varactor biasing circuit 351.

The basic oscillator circuit 350 includes both components which comprise part of a GaAs frequency converter chip (those to the left of partition line 306) and a number of off-chip discrete components (those to the right of partition line 306). The Clapp oscillator circuit 350 is formed by MESFET 302, resistor 303, capacitors 304 and 305, varactor 308 and inductor 309. Resistor 301 helps bias MESFET 302, and DC blocking capacitor 307 isolates the varactor bias voltage at node 310 from the gate of MESFET 302.

The varactor biasing circuit 351 is simply a conventional low-pass line filter to reduce line noise from a DC supply connected to node 317. Capacitors 312, 314 and 316, and resistors 313 and 315 provide several stages of low-pass line filtering. In addition, capacitor 312 should be a low series inductance decoupling capacitor since the inductance looking into resistor 313 must be very low. Without such a decoupling capacitor 312, the inductance of the supply can easily exceed the inductance of inductor 320. Thus, node 311 represents a better (lower noise, lower inductance) AC ground than node 317. Varactor biasing circuit 351 is essentially equivalent to a low noise DC voltage source connected between ground and node 311.

The component values for the circuits of FIGS. 3 and 4 are as follows:
resistor 301: 25 Ohm (on-chip)
transistor 302: GaAs MESFET (on-chip)
resistor 303: 200 Ohm (on-chip)

capacitor 304: 10.6 pF (on-chip)
capacitor 305: 8.5 pF (on-chip)
capacitor 307: 0.01 uF (discrete)
varactor 308: part #B811 (discrete)
inductor 309: air coil (approx. 10 windings)
capacitor 312: 0.01 uF (discrete)
resistor 313: 10 KOhm (discrete)
capacitor 314: 0.01 uF (discrete)
resistor 315: 10 KOhm (discrete)
capacitor 316: 1 uF (discrete)
inductor 320: 80 nH (discrete)
resistor 321: 50 Ohm (discrete)
resistor 401: 10 KOhm (discrete)

In the conventional Clapp type oscillator of FIG. 4, varactor 308 at node 310 is isolated from its DC bias 311 by a large (10K) resistor 401. In the Clapp oscillator according to the present invention shown in FIG. 3, the varactor terminal at node 310 is connected to its DC bias at node 311 via a series connected 80 nH inductor 320 and 50 Ohm resistor 321. As with the previously discussed Colpitts oscillator of FIG. 2, inductor 320 has a small enough inductance that a significant portion of the low frequency random noise at node 310 will be shunted to AC ground node 311. The low frequency noise voltage across varactor 308 and the near carrier phase noise in the oscillator of FIG. 3 are thereby reduced. The 50 Ohm series resistor 321 is necessary to reduce the "Q" of the circuit at a secondary resonant frequency caused by inductor 320.

Figure 5:
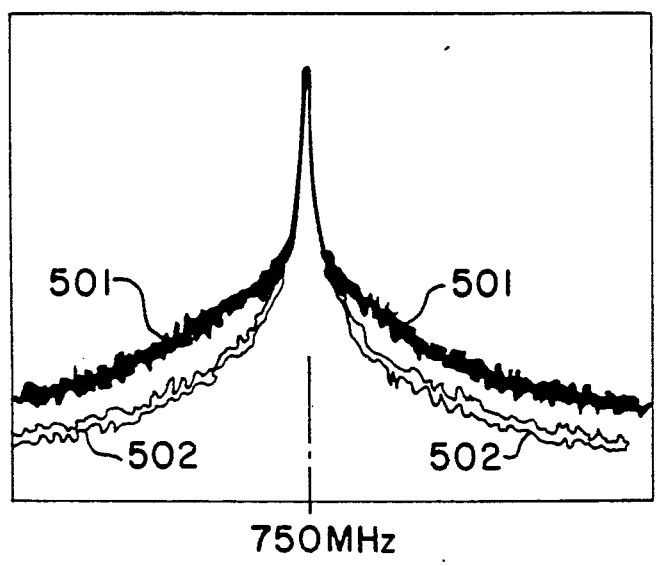

FIG. 5 depicts the measured near carrier phase noise performance of the two Colpitts oscillators of FIGS. 3 and 4. It is evident from FIG. 5 that the oscillator according to the present invention (circuit in FIG. 3) achieves significantly lower phase noise 502 near the 750 MHz carrier frequency than that 501 of the prior art oscillator (circuit in FIG. 4). In fact, the magnitude of the noise reduction achieved by the present invention was 8-12 dB in the phase noise measured ±10 Khz from the carrier over the oscillator tuning range of 750-1250 Mhz. This phase noise reduction does not rely on any anomalies of the integrated circuit fabrication process and was realized in 99% of one thousand chips tested.

Although not preferred, the present invention may also be practiced using a resistive noise shunt. For example, this could be accomplished by significantly reducing the resistance of resistor 401 shown in the prior art oscillator of FIG. 4. Unlike the preferred embodiments which employ inductive noise shunting, a resistive noise shunt will tend to cause the undesirable side effect of reducing the gain in the oscillator feedback loop.

Finally, the operation of the present invention may also be understood in terms of impedance rather than current shunting. Consider, for example, the oscillator in accordance with the invention shown in FIG. 3. The back-biased semiconductor junctions at the gate of MESFET 302 and at varactor 308 inject random shot or other noise currents into node 310. The resulting voltage noise at node 310 depends on the impedance to AC ground at node 310. The higher the impedance, the larger the voltage noise at node 310 resulting from the shot noise currents. It is this voltage noise at node 310 which, it is believed, modulates the varactor capacitance and leads to phase noise. Thus, by choosing a lower inductance for inductor 320 in accordance with the invention, the low frequency impedance at node 310 is reduced. This results in a reduction of the low frequency voltage noise at node 310 and the near-carrier phase noise of the VCO.

It will be evident to those of skill in the art that the preferred embodiments depicted in FIGS. 1, 2, and 3 represent only a few of the many circuits within the scope of the present invention, which is intended to be limited only in accordance with the following claims.

What is claimed is:

1. A voltage-controlled oscillator including:
   a varactor for controlling the frequency of oscillations in the oscillator; and,
   inductive means for providing a low impedance path to shunt low frequency noise that can modulate the capacitance of the varactor away from the varactor, thereby reducing phase noise in the oscillator.

2. The oscillator of claim 1, wherein the inductive means comprises an inductor.

3. The oscillator of claim 2, wherein the oscillator is a Hartley type oscillator.

4. The oscillator of claim 2, wherein the inductive means further comprises a resistor connected in series with the inductor.

5. The oscillator of claim 4, wherein the oscillator is a Clapp type oscillator.

6. The oscillator of claim 5, further comprising a GaAs MESFET.

7. The oscillator of claim 4, wherein the oscillator is a Colpitts type oscillator.

8. A method for reducing phase noise in a voltage controlled oscillator of the type which includes a varactor and at least one AC ground node, which phase noise is caused by low frequency random electronic noise at the varactor, said method comprising:
   shunting a portion of the low frequency random electronic noise from a terminal of the varactor to an AC ground node.

9. The oscillator of claim 8, further comprising a DC voltage supply including a biasing terminal for biasing the varactor, wherein the AC ground node is the biasing terminal of the DC voltage supply.

10. A method for reducing phase noise in a voltage controlled oscillator of the type which includes a varactor and at least one AC ground node, said method comprising:
    shunting a portion of the low frequency random electronic noise from a terminal of the varactor to an AC ground node.

11. A method for reducing phase noise as in claim 10, wherein the shunting of low frequency random noise occurs via inductive means.

12. A method for reducing phase noise as in claim 11, wherein the inductive means comprises an inductor.

13. A method of reducing phase noise as in claim 12, wherein the inductive means further comprises a resistor connected in series with the inductor.

14. In a voltage-controlled oscillator of the type which includes a varactor for tuning the oscillator, inductive means connected in circuit with the varactor for shunting a portion of the low frequency random electronic noise away from the varactor, thereby reducing phase noise in the oscillator.

15. The inductive means of claim 14, wherein the inductive means is connected between a terminal of the varactor and a AC ground node.

16. The inductive means of claim 15, wherein the inductive means comprises an inductor with inductance small enough to effect a shunting of a portion of the low frequency random electronic noise away from the varactor and large enough not to effect a significant change in the resonant frequency of the oscillator.

17. The inductive means of claim 16, wherein the inductive means further comprises a resistor connected in series with the inductor, wherein the resistance of the resistor is large enough to prevent a secondary frequency of oscillation caused by the inductor and small enough to prevent the resistor from contributing significant additional random electronic noise to the varactor.

18. A voltage-controlled oscillator including:
an AC ground node;
a varactor for controlling the frequency of oscillations in the oscillator; and,
inductive means connected in circuit between a terminal of the varactor and the AC ground node for reducing the low frequency impedance between said varactor terminal and the AC ground node of the oscillator, thereby reducing phase noise in the oscillator.

19. A voltage-controlled oscillator including:
an AC ground node;
a varactor for controlling the frequency of oscillations in the oscillator; and,
means connected in circuit between a terminal of the varactor and the AC ground node for reducing the impedance between said varactor terminal and the AC ground node, thereby reducing phase noise in the oscillator.

20. A voltage-controlled crystal oscillator including:
a piezo-electric crystal for setting a base frequency of oscillations in the oscillator;
a varactor for varying the frequency of oscillations in the oscillator away from the base frequency; and,
inductive means connected to the varactor for providing a low impedance path to shunt low frequency noise away from the varactor, thereby reducing phase noise in the oscillator.

21. The oscillator of claim 20, wherein the inductive means comprises an inductor.

22. The oscillator of claim 21, wherein the oscillator is a Pierce type oscillator.

23. The oscillator of claim 21, wherein the inductive means further comprises a resistor connected in series with the inductor.

24. The oscillator of claim 23, wherein the oscillator is a Colpitts type oscillator.

25. A voltage-controlled oscillator comprising:
a feedback oscillator circuit for providing an output signal and including a tuning node, the capacitance at the tuning node determining the frequency of oscillations in the feedback circuit;
tuning means, including a varactor, coupled to said tuning node for varying the capacitance at said tuning node thereby varying the frequency of oscillations in said feedback oscillator circuit; and
inductive means connected in circuit with said varactor for providing a low impedance path to shunt low frequency random electronic noise away from the varactor thereby reducing low frequency noise-induced modulations in the varactor capacitance and phase noise in the oscillator.

26. A voltage-controlled oscillator comprising:
a feedback oscillator circuit for providing an output signal and including a tuning node, the capacitance at the tuning node determining the frequency of oscillations in the feedback circuit;
tuning means, including a voltage-controlled reactance element, coupled to said tuning node for varying the reactance at said tuning node thereby varying the frequency of oscillations in said feedback oscillator circuit; and
inductive means connected in circuit with said voltage-controlled reactance element for providing a low impedance path to shunt low frequency random electronic noise away from the reactance element thereby reducing low frequency noise-induced modulations in the reactance of the voltage-controlled reactance element and phase noise in the oscillator.

* * * * *